United States Patent [19]

Hand et al.

[11] 4,271,533

[45] Jun. 2, 1981

[54] AFC INTERFACE CIRCUIT

[75] Inventors: Wilfred L. Hand, Clarence; Victor J. Jacek, Leroy, both of N.Y.

[73] Assignee: GTE Products Corporation, Stamford, Conn.

[21] Appl. No.: 164,198

[22] Filed: Jun. 30, 1980

Related U.S. Application Data

[63] Continuation-in-part of Ser. No. 56,569, Jul. 11, 1979, abandoned.

[51] Int. Cl.³ ............................................... H04B 1/16
[52] U.S. Cl. .................................... 455/192; 455/259; 455/261; 455/264
[58] Field of Search ............... 455/173, 182, 192, 195, 455/258, 259, 261, 262, 264; 331/36 R, 36 C; 358/195.1

[56] References Cited

U.S. PATENT DOCUMENTS

| 3,697,885 | 10/1972 | Avins et al. | 455/192 |
| 3,934,191 | 1/1976 | Garskamp | 455/192 |

*Primary Examiner*—Jin F. Ng
*Attorney, Agent, or Firm*—John A. Odozynski

[57] ABSTRACT

An interface circuit that couples the output of a differential AFC detector to a tuner and in so doing provides a single-ended control signal and a substantially constant reference signal. A bridging circuit combines the differential outputs to effect a substantially constant signal which is appropriately scaled by a referencing circuit so as to develop the reference voltage required. A dividing circuit coupled to one of the differential outputs develops an AFC control voltage having the range required to accommodate the tuner's AFC-responsive circuitry.

10 Claims, 1 Drawing Figure

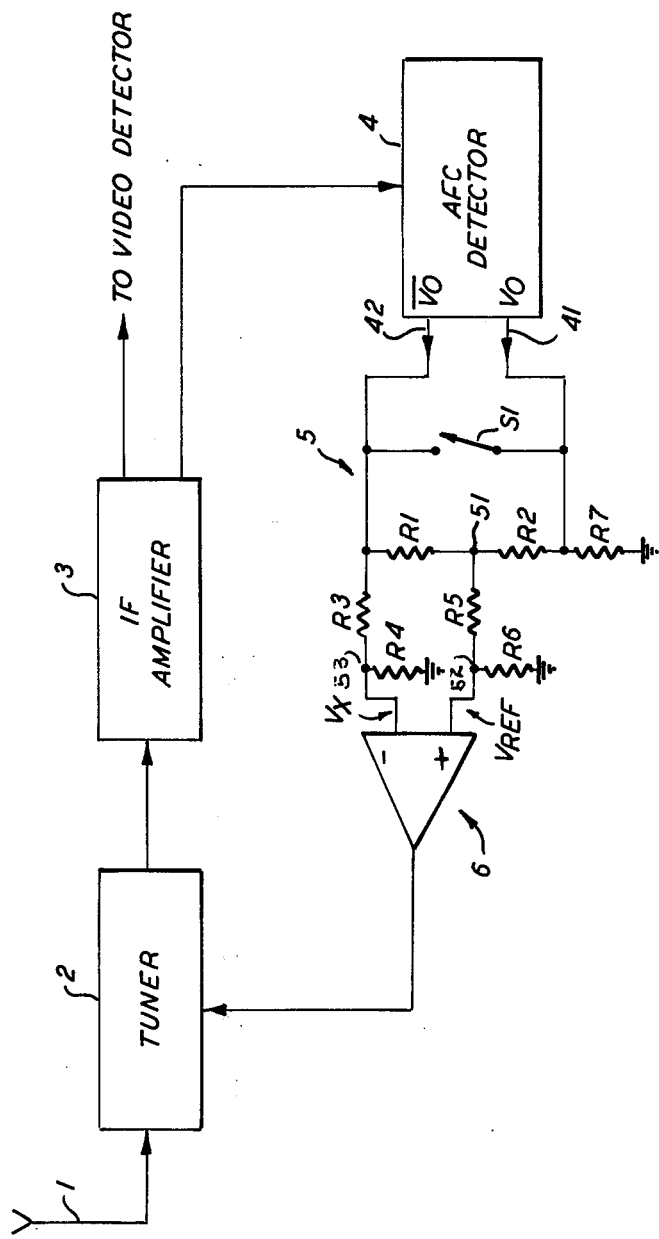

AFC INTERFACE CIRCUIT

CROSS-REFERENCE TO A RELATED APPLICATION

This application is a continuation-in-part of Ser. No. 056,569, "An AFC Interface Circuit", filed on July 11, 1979, by the same inventors and assigned to the same assignee as this application, now abandoned.

TECHNICAL FIELD

This invention relates to AFC circuitry in general and more particularly to a circuit for coupling the (differential) output of an AFC detector to the inputs of an AFC-responsive oscillator.

BACKGROUND ART

Automatic Frequency Control (AFC) has become a standard feature in high-performance television receivers. As is well-known, such circuitry detects deviations from the nominal IF, 45.75 MHz, and develops an error signal in response thereto. The error signal is applied to a voltage-controlled element, e.g. varactor diode, in the receiver's local oscillator circuitry in such manner so as to reduce deviations from the nominal IF.

As elsewhere in the receiver's circuitry, standard integrated circuits are now being used to implement many AFC-related functions, thereby improving performance and reducing circuit complexity. Specifically, a Toshiba integrated circuit designated as 7611 effectively performs both the IF amplifier and the AFC detector functions. Briefly, a sample of the IF signal is coupled to the input of the 7611 AFC detector and it develops differential output signals in response to the IF. However, the output signal levels developed must necessarily be conditioned according to the characteristics of the receiver's local oscillator. The subject invention is directed to an AFC interface circuit that performs this function.

DISCLOSURE OF THE INVENTION

The above and other objects and advantages are achieved in one aspect of this invention by an AFC interface circuit coupled between the differential outputs of an AFC detector and having AFC reference and AFC control outputs. Bridging means, coupled between the differential outputs, provides a substantially unchanging signal at its output. This output is coupled to referencing means that provides an appropriate AFC reference at the AFC reference output. Dividing means, coupled to one of the differential inputs, provides an appropriate AFC control signal at the AFC control output.

The subject invention effectively drives a single-ended tuner AFC circuit from a differential AFC detector and provides an AFC reference signal which can be tracked by the control signal, thereby circumventing difficulties associated with changing ambient temperature and power supply variations.

BRIEF DESCRIPTION OF THE DRAWING

The sole drawing is a schematic diagram of the subject invention; conventional cooperating elements are shown in block form.

BEST MODE OF CARRYING OUT THE INVENTION

For a better understanding of the present invention, together with other and further objects, advantages and capabilities thereof, reference is made to the following disclosure and appended claims in connection with the above drawing.

Referring now to the drawing, an antenna 1 intercepts a radio frequency (RF) signal and couples that signal to the input of a tuner 2. The tuner amplifies, filters and converts the RF signal to an IF signal having a nominal frequency equal to approximately 45.75 MHz, the difference between the frequency of the intercepted RF signal and the frequency of the tuner's local oscillator. It is well understood that the local oscillator signal may be generated in various fashions, including through the use of frequency synthesis techniques. The IF output of the tuner is coupled to the input of an IF amplifier 3 where it is further amplified and filtered. The output of the IF amplifier is coupled to the Video Detector and from there to the remaining portions of the receiver's signal processing and deflection circuitry. A part of the IF signal is also tapped off, usually at a point somewhat ahead of the IF output, and coupled to the AFC detector 4. In this embodiment the AFC detector is incorporated in a Toshiba integrated circuit device, 7611. The function of the AFC detector is to develop a voltage that varies according to the actual frequency of the IF signal. In a manner well understood to those skilled in the design of AFC systems, this voltage is then appropriately conditioned and applied to a voltage-dependent reactive element, for example, a varactor diode, in the tuner's local oscillator so as to compensate for any deviations from the nominal IF of 45.75 MHz.

One of the salient features of the 7611 is that it develops balanced, differential outputs in response to the frequency of the input IF signal. These outputs, $V_o$, and $\overline{V_o}$, are present at terminals 41 and 42, respectively. It can be assumed that the voltages at these outputs vary more or less linearly as a function of the IF. Under open loop conditions $V_o$ varies from approximately 10.1 to 2.2 volts as the IF varies from 45.84 MHz to 45.68 MHz, with a nominal value of 5.5 volts at 45.75 MHz. Conversely, $\overline{V_o}$ varies in the opposite direction from 2.2 to 10.1 volts over the same frequency range.

In a manner to be described below, an interface circuit 5 appropriately conditions the 7611 output so as to effectuate proper AFC operation in conjunction with specific characteristics of the tuner's AFC circuitry. Briefly, because the tuner requires only a single ended output from the AFC detector, only one output of the 7611 is needed to develop an AFC control voltage. The interface circuit includes two substantially equal-valued bridging resistors, R1 and R2, connected in series across the outputs of the 7611 and having, in effect, a center-tap at terminal 51. Were the outputs of the 7611 ideally differential and balanced, the voltage at the center tap would be constant and equal to approximately 5.5 volts. In practice the voltage at that point varies from approximately 4.9 to 5.8 volts. Referencing resistors R5 and R6 provide an AFC reference voltage, $V_{REF}$, that varies from approximately 2.2 to 2.6 volts. $V_{REF}$ is coupled to the AFC reference output of the interface circuit, at terminal 52, and to one input of amplifier 6. The referencing resistors are needed because the value of $V_{REF}$ required by amplifier 6 may be different from the nominal 5.5 volts present at terminal 51. Nevertheless, the referencing resistors allow the reference voltage to track the voltage at terminal 51. The interface circuit also includes dividing resistors R3 and R4 for developing the desired amount of AFC control voltage, $V_x$. $V_x$ is coupled to the AFC control output of the interface circuit, at terminal 53, and to the other input of amplifier 6. The amplifier output, a voltage dependent on the difference between $V_x$ and $V_{REF}$, is coupled to a voltage-dependent reactive element in the tuner's local oscillator circuit. Amplifier 6 is illustrated as a differential amplifier so that its output, that is, the voltage applied to the tuner's tuning voltage control terminal, can be generally described as equal to $[K+A(V_{REF}-V_x)]$, where K is the amplifier's quiescent output voltage and A is its differential gain. R3 is connected between $V_o$ and the control input of amplifier 6; R4 is connected from there to a reference potential, ground. In this embodiment the values of R3 and R4 are selected so that $V_x$ varies from approximately 3.8 to 0.8 volts. A balancing resistor R7, having a value approximately equal to the sum of the values of R3 and R4, is connected between $V_o$ and ground. R7 assures equal impedances at the $V_o$ and $V_o$ outputs, thereby maintaining the balanced outputs of the 7611. In order to provide means for tuning, calibration, and nominal operating point indication a switch, S1, is connected across the outputs of the 7611. S1 is normally open and closed only when required to perform the specified service-type functions.

From the description above it can be seen that, although a detailed interface circuit has been set forth, this invention contemplates variations and modifications when used with other types of AFC detectors having differential outputs or with tuners having different AFC characteristics. In any event, this invention represents a simple way of interfacing a differential AFC detector to a single-ended tuner AFC section and means for providing the desired reference voltage and range of control voltage. Furthermore, because the control voltage and reference voltage are derived from a common source, that is both sides of a differential detector output, the control voltage will track the reference voltage, thereby circumventing difficulties associated with temperature changes and power supply variations.

Accordingly, while there has been shown and described what are at present considered the preferred embodiments of the invention, it will be obvious to those skilled in the art that various changes and modifications may be made therein without departing from the scope of the invention as defined by the appended claims.

INDUSTRIAL APPLICABILITY

This invention is useful in all types of AFC-responsive electronic equipment which require a single-ended control signal and a reference signal to be derived from an AFC detector that provides a differential output signal.

We claim:

1. An AFC interface circuit coupled to first and second differential outputs of a differential AFC detector, said circuit having an AFC reference output and an AFC control output, said outputs coupled to a tuning means, the circuit comprising:
   bridging means coupled between the first and second differential outputs for providing at its output a substantially unchanging signal,
   referencing means coupled between the output of the bridging means and the AFC reference output for providing an appropriate AFC reference signal at the AFC reference output, and
   dividing means coupled between the first differential output and the AFC control output for providing an appropriate AFC control signal at the AFC control output.

2. An AFC interface circuit as described in claim 1 further comprising balancing means, coupled to the second differential output for balancing the signals at the differential outputs.

3. An AFC interface circuit as defined in either claim 1 or claim 2 further comprising calibrating means coupled between the first and second differential outputs.

4. A circuit as defined in claim 1 wherein the bridging means includes at least two substantially equal-valued resistances connected in series between the first and second differential outputs of the AFC detector.

5. A circuit as defined in claim 1 wherein the referencing means includes a first resistance coupled at one end to the output of the bridging means and a second resistance coupled between the other end of the first resistance and a reference potential so that an AFC reference voltage appears at the junction of said first and second resistances.

6. A circuit as defined in claim 1 wherein the dividing means includes a resistance coupled between the first differential output of the AFC detector and the AFC control output and a resistance coupled from that point to a reference potential.

7. An AFC interface circuit for an AFC detector having first and second differential outputs, said circuit having an AFC reference output and an AFC control output, said outputs coupled to a tuning means, said circuit comprising:
   a bridging resistance coupled across the differential outputs and having a center-tap;
   a referencing resistance coupled between the center-tap and an AFC reference output of the interface circuit; and
   a dividing resistance coupled between the first differential output and an AFC control output of the interface circuit.

8. A circuit as defined in claim 7 further comprising a balancing resistance coupled between the second differential output and a reference potential.

9. A circuit as defined in claim 8 further comprising calibrating means coupled in parallel with the bridging resistance.

10. A circuit as defined in claim 9 further comprising resistances coupled from the AFC reference and control outputs of the interface circuit to a reference potential.

* * * * *